United States Patent
Jung

(10) Patent No.: US 8,946,830 B2
(45) Date of Patent: Feb. 3, 2015

(54) METAL OXIDE PROTECTIVE LAYER FOR A SEMICONDUCTOR DEVICE

(75) Inventor: Sung-Hoon Jung, Chandler, AZ (US)

(73) Assignee: ASM IP Holdings B.V., Almere (NL)

( * ) Notice: Subject to any disclaimer, the term of this patent is extended or adjusted under 35 U.S.C. 154(b) by 245 days.

(21) Appl. No.: 13/439,528

(22) Filed: Apr. 4, 2012

(65) Prior Publication Data

US 2013/0264659 A1  Oct. 10, 2013

(51) Int. Cl.
*H01L 21/316* (2006.01)
*H01L 29/78* (2006.01)

(52) U.S. Cl.
USPC ............................ 257/411; 438/763

(58) Field of Classification Search
CPC ...... H01L 29/4966; H01L 21/02172; H01L 21/02175; H01L 21/02178; H01L 21/02181; H01L 21/02183; H01L 21/02186; H01L 21/02189; H01L 21/02192; H01L 21/02194; H01L 21/02197; H01L 21/3141; H01L 21/3142
USPC .......................... 438/763; 257/411
See application file for complete search history.

(56) References Cited

U.S. PATENT DOCUMENTS

| | | | |
|---|---|---|---|
| 2,745,640 A | 5/1956 | Cushman | |
| 2,990,045 A | 9/1959 | Root | |
| 3,833,492 A | 9/1974 | Bollyky | |
| 3,854,443 A | 12/1974 | Baerg | |
| 3,862,397 A | 1/1975 | Anderson et al. | |
| 3,887,790 A | 6/1975 | Ferguson | |
| 4,058,430 A | 11/1977 | Suntola et al. | |
| 4,176,630 A | 12/1979 | Elmer | |
| 4,194,536 A | 3/1980 | Stine et al. | |
| 4,389,973 A | 6/1983 | Suntola et al. | |
| 4,393,013 A | 7/1983 | McMenamin | |
| 4,436,674 A | 3/1984 | McMenamin | |
| 4,570,328 A * | 2/1986 | Price et al. | 438/586 |
| 4,653,541 A | 3/1987 | Oehlschlaeger et al. | |
| 4,722,298 A | 2/1988 | Rubin et al. | |
| 4,735,259 A | 4/1988 | Vincent | |
| 4,753,192 A | 6/1988 | Goldsmith et al. | |
| 4,789,294 A | 12/1988 | Sato et al. | |

(Continued)

FOREIGN PATENT DOCUMENTS

| | | |
|---|---|---|
| CN | 1563483 A | 1/2005 |
| CN | 101330015 | 12/2008 |

(Continued)

OTHER PUBLICATIONS

USPTO; Office Action dated Aug. 27, 2010 in U.S. Appl. No. 12/118,596.

(Continued)

*Primary Examiner* — Daniel Shook
(74) *Attorney, Agent, or Firm* — Snell & Wilmer LLP

(57) ABSTRACT

Embodiments related to metal oxide protective layers formed on a surface of a halogen-sensitive metal-including layer present on a substrate processed in a semiconductor processing reactor are provided. In one example, a method for forming a metal oxide protective layer is provided. The example method includes forming a metal-including active species on the halogen-sensitive metal-including layer, the metal-including active species being derived from a non-halogenated metal oxide precursor. The example method also includes reacting an oxygen-containing reactant with the metal-including active species to form the metal oxide protective layer.

20 Claims, 6 Drawing Sheets

(56) References Cited

U.S. PATENT DOCUMENTS

| | | |
|---|---|---|
| 4,821,674 A | 4/1989 | deBoer et al. |
| 4,991,614 A | 2/1991 | Hammel |
| 5,062,386 A | 11/1991 | Christensen |
| 5,167,716 A | 12/1992 | Boitnott et al. |
| 5,199,603 A | 4/1993 | Prescott |
| 5,221,556 A | 6/1993 | Hawkins et al. |
| 5,243,195 A | 9/1993 | Nishi |
| 5,380,367 A | 1/1995 | Bertone |
| 5,595,606 A | 1/1997 | Fujikawa et al. |
| 5,632,919 A | 5/1997 | MacCracken et al. |
| 5,730,801 A | 3/1998 | Tepman |
| 5,732,744 A | 3/1998 | Barr et al. |
| 5,736,314 A | 4/1998 | Hayes et al. |
| 5,796,074 A | 8/1998 | Edelstein et al. |
| 5,836,483 A | 11/1998 | Disel |
| 5,855,680 A | 1/1999 | Soininen et al. |
| 5,979,506 A | 11/1999 | Aarseth |
| 6,013,553 A | 1/2000 | Wallace |
| 6,015,465 A | 1/2000 | Kholodenko et al. |
| 6,060,691 A | 5/2000 | Minami et al. |
| 6,083,321 A | 7/2000 | Lei et al. |
| 6,086,677 A | 7/2000 | Umotoy et al. |
| 6,122,036 A | 9/2000 | Yamasaki et al. |
| 6,125,789 A | 10/2000 | Gupta et al. |
| 6,129,044 A | 10/2000 | Zhao et al. |
| 6,148,761 A | 11/2000 | Majewski et al. |
| 6,161,500 A | 12/2000 | Kopacz et al. |
| 6,274,878 B1 | 8/2001 | Li et al. |
| 6,287,965 B1 | 9/2001 | Kang et al. |
| 6,302,964 B1 | 10/2001 | Umotoy et al. |
| 6,312,525 B1 | 11/2001 | Bright et al. |
| 6,326,597 B1 | 12/2001 | Lubomirsky et al. |
| 6,342,427 B1 | 1/2002 | Choi et al. |
| 6,367,410 B1 | 4/2002 | Leahey et al. |
| 6,368,987 B1 | 4/2002 | Kopacz et al. |
| 6,420,279 B1 | 7/2002 | Ono et al. |
| 6,454,860 B2 | 9/2002 | Metzner et al. |
| 6,478,872 B1 | 11/2002 | Chae et al. |
| 6,482,331 B2 | 11/2002 | Lu et al. |
| 6,483,989 B1 | 11/2002 | Okada et al. |
| 6,511,539 B1 | 1/2003 | Raaijmakers |
| 6,569,239 B2 | 5/2003 | Arai et al. |
| 6,590,251 B2 | 7/2003 | Kang et al. |
| 6,594,550 B1 | 7/2003 | Okrah |
| 6,598,559 B1 | 7/2003 | Vellore et al. |
| 6,627,503 B2 | 9/2003 | Ma et al. |
| 6,648,974 B1 | 11/2003 | Ogliari et al. |
| 6,682,973 B1 | 1/2004 | Paton et al. |
| 6,710,364 B2 | 3/2004 | Guldi et al. |
| 6,734,090 B2 | 5/2004 | Agarwala et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,847,014 B1 | 1/2005 | Benjamin et al. |
| 6,858,547 B2 | 2/2005 | Metzner |
| 6,875,677 B1 | 4/2005 | Conley, Jr. et al. |
| 6,884,066 B2 | 4/2005 | Nguyen et al. |
| 6,889,864 B2 | 5/2005 | Lindfors et al. |
| 6,909,839 B2 | 6/2005 | Wang et al. |
| 6,930,059 B2 | 8/2005 | Conley, Jr. et al. |
| 6,935,269 B2 | 8/2005 | Lee et al. |
| 7,045,430 B2 | 5/2006 | Ahn et al. |
| 7,053,009 B2 | 5/2006 | Conley, Jr. et al. |
| 7,071,051 B1 | 7/2006 | Jeon et al. |
| 7,115,838 B2 | 10/2006 | Kurara et al. |
| 7,122,085 B2 | 10/2006 | Shero et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,147,766 B2 | 12/2006 | Uzoh et al. |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,204,887 B2 | 4/2007 | Kawamura et al. |
| 7,205,247 B2 | 4/2007 | Lee et al. |
| 7,235,501 B2 | 6/2007 | Ahn et al. |
| 7,312,494 B2 | 12/2007 | Ahn et al. |
| 7,329,947 B2 | 2/2008 | Adachi et al. |
| 7,357,138 B2 | 4/2008 | Ji et al. |
| 7,393,736 B2 | 7/2008 | Ahn et al. |
| 7,402,534 B2 | 7/2008 | Mahajani |
| 7,405,166 B2 | 7/2008 | Liang et al. |
| 7,405,454 B2 | 7/2008 | Ahn et al. |
| 7,414,281 B1 | 8/2008 | Fastow |
| 7,437,060 B2 | 10/2008 | Wang et al. |
| 7,442,275 B2 | 10/2008 | Cowans |
| 7,489,389 B2 | 2/2009 | Shibazaki |
| 7,547,363 B2 | 6/2009 | Tomiyasu et al. |
| 7,601,223 B2 | 10/2009 | Lindfors et al. |
| 7,601,225 B2 | 10/2009 | Tuominen et al. |
| 7,640,142 B2 | 12/2009 | Tachikawa et al. |
| D614,153 S | 4/2010 | Fondurulia et al. |
| 7,723,648 B2 | 5/2010 | Tsukamoto et al. |
| 7,740,705 B2 | 6/2010 | Li |
| 7,780,440 B2 | 8/2010 | Shibagaki et al. |
| 7,833,353 B2 | 11/2010 | Furukawahara et al. |
| 7,851,019 B2 | 12/2010 | Tuominen et al. |
| 7,884,918 B2 | 2/2011 | Hattori |
| 8,041,197 B2 | 10/2011 | Kasai et al. |
| 8,071,452 B2 | 12/2011 | Raisanen |
| 8,072,578 B2 | 12/2011 | Yasuda |
| 8,076,230 B2 | 12/2011 | Wei |
| 8,076,237 B2 | 12/2011 | Uzoh |
| 8,082,946 B2 | 12/2011 | Laverdiere et al. |
| 8,092,604 B2 | 1/2012 | Tomiyasu et al. |
| 8,137,462 B2 | 3/2012 | Fondurulia et al. |
| 8,147,242 B2 | 4/2012 | Shibagaki et al. |
| 8,278,176 B2 | 10/2012 | Bauer et al. |
| 8,282,769 B2 | 10/2012 | Iizuka |
| 8,293,016 B2 | 10/2012 | Bahng et al. |
| 8,309,173 B2 | 11/2012 | Tuominen et al. |
| 8,367,528 B2 | 2/2013 | Bauer et al. |
| 8,608,885 B2 | 12/2013 | Goto et al. |
| 8,683,943 B2 | 4/2014 | Onodera et al. |
| 8,711,338 B2 | 4/2014 | Liu et al. |
| 8,726,837 B2 | 5/2014 | Patalay et al. |
| 2002/0001974 A1 | 1/2002 | Chan |
| 2002/0064592 A1 | 5/2002 | Datta et al. |
| 2002/0108670 A1 | 8/2002 | Baker et al. |
| 2002/0115252 A1* | 8/2002 | Haukka et al. ............... 438/240 |
| 2002/0172768 A1 | 11/2002 | Endo et al. |
| 2002/0187650 A1 | 12/2002 | Blalock et al. |
| 2003/0019580 A1 | 1/2003 | Strang |
| 2003/0042419 A1 | 3/2003 | Katsumata et al. |
| 2003/0066826 A1 | 4/2003 | Lee et al. |
| 2003/0075925 A1 | 4/2003 | Lindfors et al. |
| 2003/0111963 A1 | 6/2003 | Tolmachev et al. |
| 2003/0141820 A1 | 7/2003 | White et al. |
| 2003/0228772 A1 | 12/2003 | Cowans |
| 2003/0232138 A1 | 12/2003 | Tuominen et al. |
| 2004/0013577 A1 | 1/2004 | Ganguli et al. |
| 2004/0144980 A1 | 7/2004 | Ahn et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0219793 A1 | 11/2004 | Hishiya et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0054228 A1 | 3/2005 | March |
| 2005/0066893 A1 | 3/2005 | Soininen |
| 2005/0070123 A1 | 3/2005 | Hirano |
| 2005/0072357 A1 | 4/2005 | Shero et al. |
| 2005/0092249 A1 | 5/2005 | Kilpela et al. |
| 2005/0100669 A1 | 5/2005 | Kools et al. |
| 2005/0110069 A1 | 5/2005 | Kil et al. |
| 2005/0173003 A1 | 8/2005 | Laverdiere et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0229972 A1 | 10/2005 | Hoshi et al. |

(56) References Cited

U.S. PATENT DOCUMENTS

| | | |
|---|---|---|
| 2005/0241176 A1 | 11/2005 | Shero et al. |
| 2005/0263075 A1 | 12/2005 | Wang et al. |
| 2005/0271813 A1 | 12/2005 | Kher et al. |
| 2005/0282101 A1 | 12/2005 | Adachi |
| 2006/0013946 A1 | 1/2006 | Park et al. |
| 2006/0019033 A1 | 1/2006 | Muthukrishnan et al. |
| 2006/0024439 A2 | 2/2006 | Tuominen et al. |
| 2006/0046518 A1 | 3/2006 | Hill et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0110934 A1 | 5/2006 | Fukuchi |
| 2006/0113675 A1 | 6/2006 | Chang et al. |
| 2006/0128168 A1 | 6/2006 | Ahn et al. |
| 2006/0148180 A1 | 7/2006 | Ahn et al. |
| 2006/0193979 A1 | 8/2006 | Meiere et al. |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0228888 A1 | 10/2006 | Lee et al. |
| 2006/0240574 A1 | 10/2006 | Yoshie |
| 2006/0257563 A1 | 11/2006 | Doh et al. |
| 2006/0258078 A1 | 11/2006 | Lee et al. |
| 2006/0266289 A1 | 11/2006 | Verghese et al. |
| 2007/0022954 A1 | 2/2007 | Iizuka et al. |
| 2007/0031599 A1 | 2/2007 | Gschwandtner et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0059948 A1 | 3/2007 | Metzner et al. |
| 2007/0065578 A1 | 3/2007 | McDougall |
| 2007/0066010 A1 | 3/2007 | Ando |
| 2007/0077355 A1 | 4/2007 | Chacin et al. |
| 2007/0084405 A1 | 4/2007 | Kim |
| 2007/0116873 A1 | 5/2007 | Li et al. |
| 2007/0134942 A1 | 6/2007 | Ahn et al. |
| 2007/0146621 A1 | 6/2007 | Yeom |
| 2007/0166457 A1 | 7/2007 | Yamoto et al. |
| 2007/0175397 A1 | 8/2007 | Tomiyasu et al. |
| 2007/0209590 A1 | 9/2007 | Li |
| 2007/0232501 A1 | 10/2007 | Tonomura |
| 2007/0252244 A1 | 11/2007 | Srividya et al. |
| 2007/0264807 A1 | 11/2007 | Leone et al. |
| 2008/0006208 A1 | 1/2008 | Ueno et al. |
| 2008/0029790 A1 | 2/2008 | Ahn et al. |
| 2008/0054332 A1 | 3/2008 | Kim et al. |
| 2008/0057659 A1 | 3/2008 | Forbes et al. |
| 2008/0075881 A1 | 3/2008 | Won et al. |
| 2008/0085226 A1 | 4/2008 | Fondurulia et al. |
| 2008/0124908 A1 | 5/2008 | Forbes et al. |
| 2008/0149031 A1 | 6/2008 | Chu et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0261413 A1 | 10/2008 | Mahajani |
| 2008/0282970 A1 | 11/2008 | Heys et al. |
| 2009/0011608 A1 | 1/2009 | Nabatame |
| 2009/0020072 A1 | 1/2009 | Mizunaga et al. |
| 2009/0061644 A1 | 3/2009 | Chiang et al. |
| 2009/0085156 A1 | 4/2009 | Dewey et al. |
| 2009/0095221 A1 | 4/2009 | Tam et al. |
| 2009/0107404 A1 | 4/2009 | Ogliari et al. |
| 2009/0136668 A1 | 5/2009 | Gregg et al. |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0261331 A1 | 10/2009 | Yang et al. |
| 2009/0277510 A1 | 11/2009 | Shikata |
| 2009/0283041 A1 | 11/2009 | Tomiyasu et al. |
| 2010/0024727 A1 | 2/2010 | Kim et al. |
| 2010/0025796 A1 | 2/2010 | Dabiran |
| 2010/0055312 A1 | 3/2010 | Kato et al. |
| 2010/0124610 A1 | 5/2010 | Aikawa et al. |
| 2010/0170441 A1 | 7/2010 | Won et al. |
| 2010/0193501 A1 | 8/2010 | Zucker et al. |
| 2010/0230051 A1 | 9/2010 | Iizuka |
| 2010/0275846 A1 | 11/2010 | Kitagawa |
| 2010/0294199 A1 | 11/2010 | Tran et al. |
| 2010/0307415 A1 | 12/2010 | Shero et al. |
| 2010/0322604 A1 | 12/2010 | Fondurulia et al. |
| 2011/0000619 A1 | 1/2011 | Suh |
| 2011/0061810 A1 | 3/2011 | Ganguly et al. |
| 2011/0070380 A1 | 3/2011 | Shero et al. |
| 2011/0097901 A1 | 4/2011 | Banna et al. |
| 2011/0108194 A1 | 5/2011 | Yoshioka et al. |
| 2011/0236600 A1 | 9/2011 | Fox et al. |
| 2011/0239936 A1 | 10/2011 | Suzaki et al. |
| 2011/0256734 A1 | 10/2011 | Hausmann et al. |
| 2011/0275166 A1 | 11/2011 | Shero et al. |
| 2012/0090704 A1 | 4/2012 | Laverdiere et al. |
| 2012/0098107 A1 | 4/2012 | Raisanen et al. |
| 2012/0160172 A1 | 6/2012 | Wamura et al. |
| 2012/0240858 A1 | 9/2012 | Taniyama et al. |
| 2012/0295427 A1 | 11/2012 | Bauer |
| 2012/0304935 A1 | 12/2012 | Oosterlaken et al. |
| 2013/0023129 A1 | 1/2013 | Reed |
| 2013/0104988 A1 | 5/2013 | Yednak et al. |
| 2013/0104992 A1 | 5/2013 | Yednak et al. |
| 2013/0126515 A1 | 5/2013 | Shero et al. |
| 2013/0129577 A1 | 5/2013 | Halpin et al. |
| 2013/0230814 A1 | 9/2013 | Dunn et al. |
| 2013/0264659 A1 | 10/2013 | Jung |
| 2013/0292676 A1 | 11/2013 | Milligan et al. |
| 2013/0292807 A1 | 11/2013 | Raisanen et al. |
| 2014/0000843 A1 | 1/2014 | Dunn et al. |
| 2014/0014644 A1 | 1/2014 | Akiba et al. |
| 2014/0027884 A1 | 1/2014 | Fang et al. |
| 2014/0036274 A1 | 2/2014 | Marquardt et al. |
| 2014/0060147 A1 | 3/2014 | Sarin et al. |
| 2014/0067110 A1 | 3/2014 | Lawson et al. |
| 2014/0073143 A1 | 3/2014 | Alokozai et al. |
| 2014/0084341 A1 | 3/2014 | Weeks |
| 2014/0103145 A1 | 4/2014 | White et al. |
| 2014/0120487 A1 | 5/2014 | Kaneko |
| 2014/0159170 A1 | 6/2014 | Raisanen et al. |
| 2014/0175054 A1 | 6/2014 | Carlson et al. |

FOREIGN PATENT DOCUMENTS

| | | |
|---|---|---|
| CN | 101423937 | 9/2011 |
| JP | 07283149 | 10/1995 |
| JP | 08335558 | 12/1996 |
| JP | 2001342570 | 12/2001 |
| JP | 2004014952 A | 1/2004 |
| JP | 2004091848 | 3/2004 |
| JP | 2004538374 | 12/2004 |
| JP | 2005507030 | 3/2005 |
| JP | 2006186271 | 7/2006 |
| JP | 2008527748 | 7/2008 |
| TW | 200701301 A | 1/2007 |
| WO | 2006056091 A1 | 6/2006 |
| WO | 2006/078666 | 7/2006 |
| WO | 2011049816 A2 | 4/2011 |

OTHER PUBLICATIONS

USPTO; Office Action dated Feb. 15, 2011 in U.S. Appl. No. 12/118,596.

USPTO; Notice of Allowance dated Aug. 4, 2011 in U.S. Appl. No. 12/118,596.

USPTO; Notice of Allowance dated Jun. 16, 2011 in U.S. Appl. No. 12/430,751.

USPTO; Notice of Allowance dated Jul. 27, 2011 in U.S. Appl. No. 12/430,751.

USPTO; Office Action dated Apr. 23, 2013 in U.S. Appl. No. 12/763,037.

USPTO; Office Action dated Jan. 15, 2013 in U.S. Appl. No. 12/754,223.

USPTO; Office Action dated Feb. 26, 2013 in U.S. Appl. No. 12/754,223.

(56) References Cited

OTHER PUBLICATIONS

PCT; International Search report and Written Opinion dated Nov. 12, 2010 in Application No. PCT/US2010/030126.
PCT; International Search report and Written Opinion dated Jan. 12, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 is Serial No. 201080015699.9.
Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.
Maeng et al. Electrical properties of atomic layer disposition Hf02 and HfOxNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.
Novaro et al. Theoretical Study on a Reaction Pathway of Ziegler-Natta-Type Catalysis, J. Chem. Phys. 68(5), Mar. 1, 1978 p. 2337-2351.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Restriction Requirement dated Dec. 16, 2013 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Restriction Requirement dated Oct. 29, 2013 in U.S. Appl. No. 13/439,258.
USPTO; Office Action dated Mar. 24, 2014 in U.S. Appl. No. 13/439,258.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Office Action dated Nov. 15, 2013 in U.S. Appl. No. 13/612,538.
USPTO; Office Action dated Apr. 24, 2014 in U.S. Appl. No. 13/784,362.
Chinese Patent Office; Notice on the First Office Action dated May 24, 2013 in Serial No. 201080036764.6.
Chinese Patent Office; Notice on the Second Office Action dated Jan. 2, 2014 in Serial No. 201080036764.6.
Japanese Patent Office; Office Action dated Dec. 25, 2014 in Serial No. 2012-504786.
USPTO; Final Office Action dated Jul. 14, 2014 in U.S. Appl. No. 12/754,223.
USPTO; Notice of Allowance dated Jul. 3, 2014 in U.S. Appl. No. 13/102,980.
USPTO; Office Action dated Jun. 3, 2014 in U.S. Appl. No. 12/854,818.
USPTO; Non-Final Office Action dated Jul. 2, 2014 in U.S. Appl. No. 13/283,408.
USPTO; Non-Final Office Action dated Jul. 30, 2014 in U.S. Appl. No. 13/284,642.
USPTO; Office Action dated Jul. 31, 2014 in U.S. Appl. No. 13/411,271.
USPTO; Final Office Action dated Jun. 18, 2014 in U.S. Appl. No. 13/535,214.
USPTO; Non-Final Office Action dated Aug. 8, 2014 in U.S. Appl. No. 13/563,066.
USPTO; Non-Final Office Action dated Jul. 10, 2014 in U.S. Appl. No. 13/612,538.
USPTO; Non-Final Office Action dated Jun. 2, 2014 in U.S. Appl. No. 13/677,151.
USPTO; Notice of Allowance dated Aug. 13, 2014 in U.S. Appl. No. 13/784,362.
USPTO; Restriction Requirement dated Jun. 26, 2014 in U.S. Appl. No. 13/874,708.
USPTO; Non-Final Office Action dated May 29, 2014 in U.S. Appl. No. 14/183,187.
Chinese Patent Office; Notice on the Third Office Action dated Jul. 1, 2014 in Application No. 201080036764.6.
Taiwan Patent Office; Office Action dated Jul. 4, 2014 in Application No. 099110511.

* cited by examiner

METAL OXIDE PROTECTIVE LAYER FOR A SEMICONDUCTOR DEVICE

BACKGROUND

Some semiconductor devices employ a high-K dielectric material (relative to $SiO_2$) as a gate dielectric to achieve a desired equivalent oxide thickness (EOT) with a film that is sufficiently thick to avoid undesirable leakage. However, some high-K dielectric materials may be incompatible with subsequently deposited materials. In some settings, the effect of such incompatibilities may compromise device performance.

SUMMARY

Various embodiments are disclosed herein that relate to forming a metal oxide protective layer on a surface of a halogen-sensitive metal-including layer present on a substrate processed in a semiconductor processing reactor. For example, one embodiment provides a method for forming a metal oxide protective layer comprising forming a metal-including active species on the halogen-sensitive metal-including layer, the metal-including active species being derived from a non-halogenated metal oxide precursor. The example method also includes reacting an oxygen-containing reactant with the metal-including active species to form the metal oxide protective layer.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
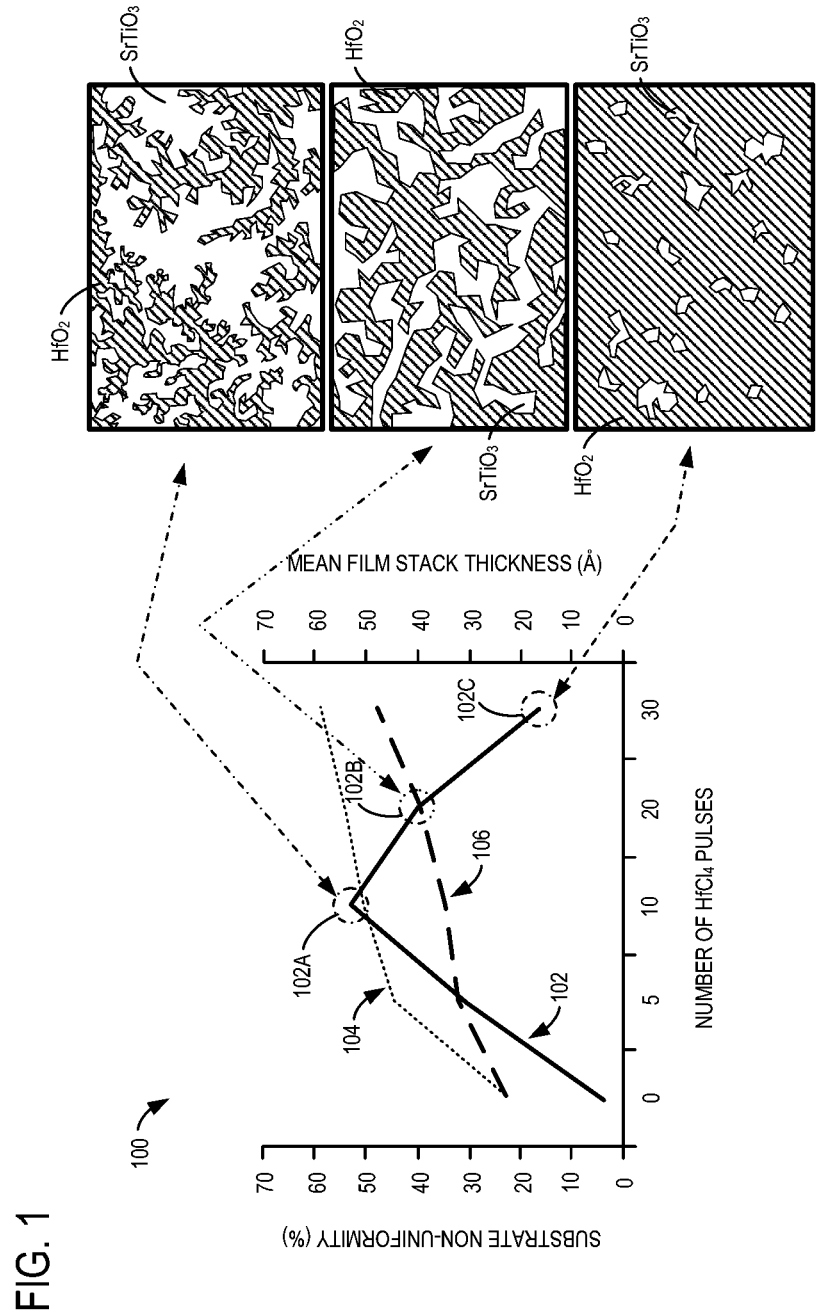
FIG. 1 shows film stack thickness and uniformity data for discontinuous $HfO_2$ films on a $SrTiO_3$ film using a halogen-including film precursor and schematically shows example surface topography for some of those discontinuous $HfO_2$ films.

Modern semiconductor devices may include high-K gate dielectric materials to improve device performance relative to devices employing $SiO_2$ gate dielectric at a given architectural size. The thickness of the gate dielectric material may shrink with the transistor size to provide a desired gate capacitance and/or drive current. The physical thickness of a $SiO_2$ gate dielectric may eventually become small enough so that leakage from the gate to the channel (e.g., from tunneling effects) raises power dissipation in the device to unacceptably high levels.

One approach to mitigate this effect is to replace the $SiO_2$ gate dielectric with a gate dielectric material having a dielectric constant value (K) that is relatively higher than the dielectric constant for $SiO_2$ (K~3-4). For example, some semiconductor devices employ $HfO_2$ (K~20-25), which may provide an equivalent oxide thickness (EOT) to a physically thinner layer of $SiO_2$. In turn, a gate including a high-K gate dielectric material may provide similar device turn-on characteristics while mitigating gate leakage and power dissipation.

As used herein, a high-K dielectric material refers to any suitable dielectric material having a dielectric constant greater than $SiO_2$. Accordingly, some transition metal oxides such as $HfO_2$ and $TiO_2$ (K~50) may be considered high-K dielectric materials. Some non-transition metal-including oxides such as $Al_2O_3$ (K~8) may be considered high-K dielectric materials. Some high-K dielectric materials may have a dielectric constant of 200 or more (e.g., ultra-high-K dielectric materials), such as some alkaline earth metal-including metal oxides. For example, $SrTi_xO_y$, $BaTi_xO_y$, $SrO$, and $Sr_xBa_{(1-x)}Ti_yO_z$ may be considered high-K dielectric materials.

Once the gate dielectric layer is formed, other dielectric or conductive layers may be formed on top of the gate dielectric layer to build the gate assembly. Because many high-K dielectric materials include one or more kinds of metal cations in an oxide lattice, the surface of the high-K dielectric material may include vacancies, defects, or charge locations that may facilitate chemical reactions during formation of a layer on top of the high-K dielectric material. Such reactions may be sensitive to the process chemistry used when forming the subsequent layer and to the reaction conditions under which the subsequent layer is formed. In some cases, these reactions may be undesirable. For example, such reactions may lead to the generation of undesirable layer morphology, the formation of non-uniform films, or the nucleation of interfacial or other defects. In turn, device performance may be degraded or destroyed.

As an example, some high-K dielectric materials may be sensitive to halogens. As used herein, a halogen-sensitive surface or layer refers to a surface or layer that is reactive with a halogen-including chemical (e.g., a reactant or film precursor), or that facilitates reaction of a halogen-including chemical (e.g., a decomposition reaction or other surface reaction), under the conditions at which the halogen-sensitive surface is exposed to the halogen-including chemical. In some settings, a halogen-sensitive surface may be reactive with a halogen-including chemical in an undesirable manner or facilitate an undesirable reaction of a halogen-including chemical. In some settings, a halogen-sensitive surface may be reactive with or facilitate a reaction of a halogen-including chemical in a manner that leads to an undesirable morphology, thickness, density, uniformity, or other characteristic in a film that is formed on top of the halogen-sensitive surface.

Accordingly, the embodiments described herein are related to forming a metal oxide protective layer on a surface of a halogen-sensitive metal-including layer present on a substrate processed in a semiconductor processing reactor. As used herein, a metal oxide protective layer comprises a metal oxide layer that is less sensitive to a halogen-including chemical than the halogen-sensitive metal-including layer under the conditions at which the metal oxide protective layer is exposed to the halogen-including chemical. In some embodiments, the metal oxide protective layer may act as a barrier or a buffer layer to physically cap an underlying halogen-sensitive metal-including layer. For example, in some embodiments, a metal oxide protective layer may be deposited on top of the halogen-sensitive metal-including layer. In some embodiments, a metal oxide protective layer may be formed from at least a portion of a surface of the halogen-sensitive metal-including layer.

For example, one embodiment provides a method for forming a metal oxide protective layer comprising forming a metal-including active species on the halogen-sensitive metal-including layer, the metal-including active species being derived from a non-halogenated metal oxide precursor. The example method also includes reacting an oxygen-containing reactant with the metal-including active species to form the metal oxide protective layer. Once formed, the metal oxide protective layer may shield the underlying halogen-sensitive metal-including layer from subsequent exposure to halogen-including chemicals.

The embodiments described herein are also related to methods of fabricating a semiconductor device. For example, one embodiment provides a method comprising forming a halogen-sensitive gate dielectric material on a substrate. The example method also comprises forming a metal oxide protective layer on an exposed surface of the halogen-sensitive gate dielectric material by reacting a metal-including active species derived from a non-halogenated metal oxide precursor with an oxygen-containing reactant. Finally, the example method comprises forming a metal-including film on top of the metal oxide protective layer by exposing the metal oxide protective layer to a halogen-including metal compound.

Some high-K films that include alkaline earth metals may include halogen-sensitive metal-including materials. For example, FIG. 1 shows film stack thickness and uniformity data 100 collected via ellipsometry for $HfO_2$ films deposited using a halogen-including film precursor on a halogen-sensitive $SrTiO_3$ high-K film. Film stack thickness and uniformity data 100 includes film stack non-uniformity data 102, which describes the within-substrate non-uniformity of the $SrTiO_3$/$HfO_2$ stack. Within-substrate non-uniformity may be calculated by measuring a suitable number of locations on the substrate surface (e.g., 49 measurement sites, though any suitable number of locations may be measured) and dividing the standard deviation of the measured thickness data by the average thickness. The calculated non-uniformity value may be expressed as a percentage by multiplying the result by 100. Film stack thickness and uniformity data 100 also includes film stack mean thickness data 104, which describes the total stack thickness.

The $HfO_2$ films shown in FIG. 1 were deposited using $HfCl_4$ via an atomic layer deposition (ALD) technique. Film stack non-uniformity data 102 and film stack mean thickness data 104 are functions of varying numbers of doses or pulses of $HfCl_4$ to the substrate surface. Employing controlled surface reactions, ALD typically provides layer-by-layer film deposition on an underlying surface. Film thickness may be built up by repeated, separated exposures of the surface to film precursors and reactants. Consequently, ALD deposition processes may provide highly-controllable film thickness and uniformity on surfaces with three-dimensional surface topography, such as stepped surfaces and the like. An ALD-deposited film may be built up to any suitable thickness by repeating a sequential deposition cycle where a population of surface active species formed on the surface from one precursor subsequently reacts with a later-supplied reactant. Under typical deposition conditions, the surface achieves some degree of saturation of chemisorbed surface active species during the deposition cycle, providing a potentially self-limiting deposition mechanism.

As shown in FIG. 1, film stack non-uniformity data 102 is dependent on the amount of halogen-containing precursor supplied to the substrate, increasing to a maximum at data point 102A and falling to successively lower values at data points 102B and 102C, respectively. Further, observed film stack mean thickness data 104 exhibits deposition rate characteristics that depart from expected film stack mean thickness data 106. Taken together, the thickness data may suggest a surface reaction mechanism that interferes with the ordinary course of an ALD process.

Schematic depictions of top views of film surfaces corresponding to data points 102A, 102B, and 102C indicate that domains of $HfO_2$ grow from islands. Extended deposition cycles cause the islands to merge. Thus, the large variation in thickness non-uniformity shown in film stack non-uniformity data 102 may reflect the discontinuous nature of a film deposition process that proceeds by nucleating, extending, and eventually merging islands of $HfO_2$ film.

Figure 2:
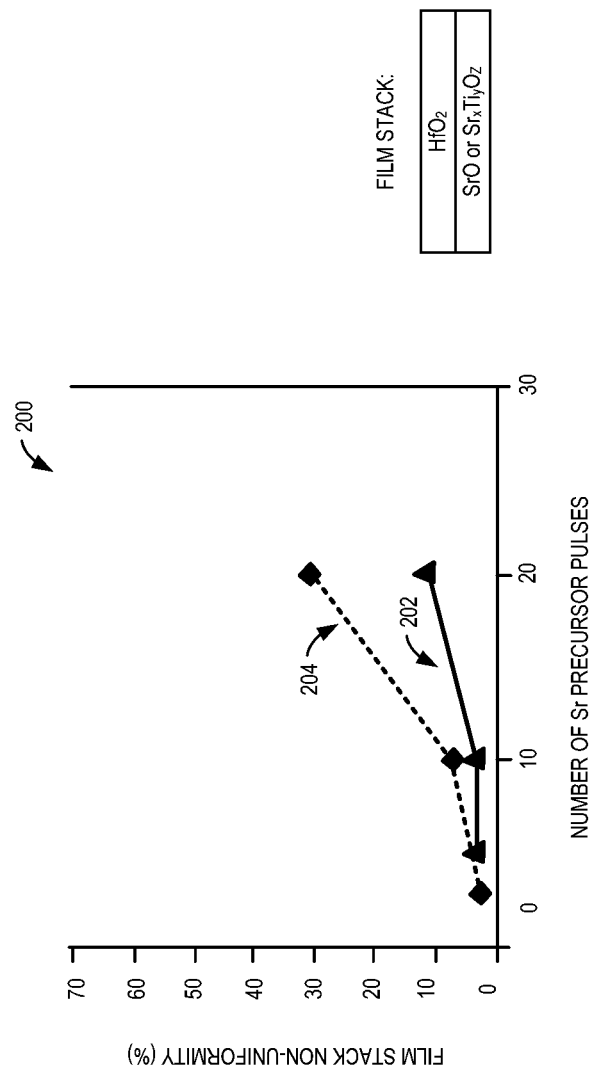
FIG. 2 shows film stack thickness and uniformity data for discontinuous $HfO_2$ films on halogen-sensitive high-K films comprising varying amounts of Sr.

FIG. 2 shows ellipsometrically-measured film stack thickness and uniformity data 200 for $HfO_2$ films formed from $HfCl_4$ on halogen-sensitive high-K films including varying amounts of Sr. For example, film stack non-uniformity data 202 depicts a relationship between film stack non-uniformity as measured on a $HfO_2$ layer formed on an SrO underlayer and a number of Sr precursor pulses supplied during SrO deposition, which corresponds somewhat to Sr content in the SrO underlayer. Film stack non-uniformity data 204 depicts a relationship between film stack non-uniformity as measured on an $HfO_2$ layer formed on a $Sr_xTi_yO$ underlayer and a number of Sr precursor pulses supplied during $Sr_xTi_yO$ deposition. For both types of Sr-containing underlayer, increasing the content of Sr present in the Sr-containing underlayer increases the non-uniformity in the total film stack.

Without wishing to be bound by theory, certain surface sites on halogen-sensitive metal-including layers may promote or retard film deposition when exposed to halogen-containing chemicals, leading to local discontinuities in the film. In the examples shown in FIGS. 1 and 2, the presence and amount of Sr present on the surface exposed to $HfCl_4$ appears to influence the degree of non-uniformity. Depending on the process conditions, Sr may interact with Cl liberated from $HfCl_4$ upon adsorption to the Sr-containing surface. The Cl may poison the surface by blocking Sr or Sr-coordinated sites where additional Hf-containing active species may form. Consequently, further adsorption and formation of Hf-containing active species may preferentially occur on existing $HfO_2$ islands. As the deposition process proceeds, $HfO_2$ islands may grow to displace Cl bound to the surface. Thus, the relative effect of halogen-sensitive sites on deposition chemistry may diminish so that the process transitions to a more typical layer-by-layer deposition mechanism. While the example described here relates to surface chemistry that may be inhibited by halogen atoms, it will be understood that halogens may promote surface reactions in a non-uniform way in some settings. Regardless of the mechanism by which the halogen interacts with the halogen-sensitive surface, it will be appreciated that such interactions may disfavor the formation and propagation of continuous, uniform films.

Forming a metal oxide protective layer on top of the halogen-sensitive metal-including layer may reduce or prevent interaction between halogen atoms subsequently supplied to the substrate. For example, a metal oxide protective layer deposited on top of an alkaline earth metal-including metal oxide may prevent the poisoning or promotion of some reactions at coordination sites proximate to alkaline earth metal atoms by occupying those sites.

It will be appreciated that any suitable metal oxide may be employed as a metal oxide protective layer. In some embodiments, the metal oxide protective layer may be selected according to materials to which the metal oxide protective layer may later be exposed during subsequent film formation and/or patterning steps, and process conditions for such steps. For example, in some embodiments, the metal oxide protective layer may exclude materials that may promote or facilitate undesirable reactions. In one scenario, the metal oxide protective layer may exclude alkaline earth metals. Further, it will be appreciated that a particular metal oxide or composition of metal oxides selected for use in a metal oxide protective layer may vary according to the kind of halogen-sensitive metal-including layer on which it will be formed. In some embodiments, a metal oxide protective layer composition may be selected based on physical parameters for the metal oxide protective layer and/or the underlying halogen-sensitive metal-including layer. For example, the metal oxide protective layer composition may be selected based on consideration of material properties such as lattice constants or material morphology, the sensitivity of the metal oxide protective layer to etch chemicals, or the ability of the metal oxide protective layer to regulate the diffusion of metals. In some settings, a metal oxide protective layer composition may be selected based on electrical and/or device performance considerations, such as the effect that the metal oxide protective layer may have on the EOT of a gate stack, device leakage, or the threshold voltage in an underlying channel.

In some embodiments, a metal oxide protective layer including a suitable titanium oxide may be formed on a halogen-sensitive metal-including layer. For example, a metal oxide protective layer including $TiO_2$ may be formed on a halogen-sensitive high-K dielectric layer. In some settings, a $TiO_2$ metal oxide protective layer may be formed on an alkaline earth metal-including metal oxide such as $SrTi_xO_y$, $BaTi_xO_y$, SrO, and $Sr_xBa_{(1-x)}Ti_yO_z$. Because $TiO_2$ is a high-K dielectric material, a suitably thin layer of $TiO_2$ may have a tolerable effect on device EOT if included in a gate stack.

Non-transition metal oxides may also be included in a metal protective oxide layer in some settings. For example, Al may be included in a metal oxide protective layer in some embodiments. In one scenario, the metal oxide protective layer may comprise $Al_2O_3$. While $Al_2O_3$ has a lower dielectric constant than $TiO_2$, including $Al_2O_3$ in a gate stack may permit adjustment of the device's threshold voltage.

Figure 3:
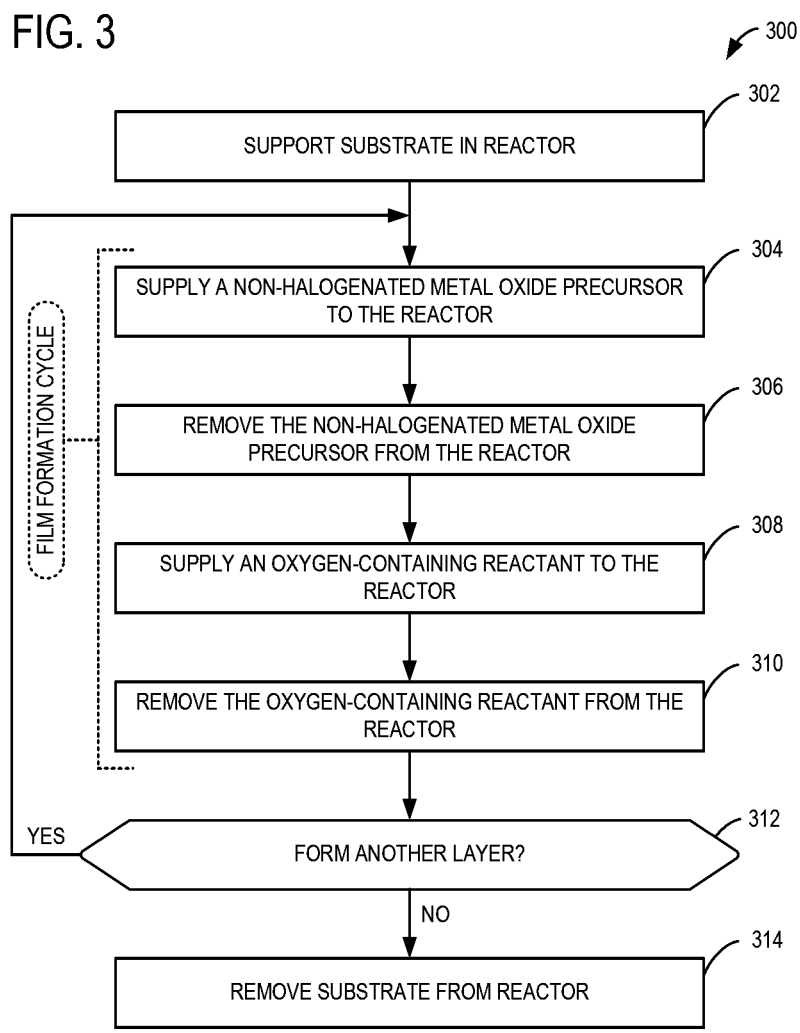
FIG. 3 shows a method of forming a metal oxide protective layer according to an embodiment of the present disclosure.

FIG. 3 shows a flowchart for an embodiment of a method 300 of forming a metal oxide protective layer comprising titanium and oxygen on a halogen-sensitive metal-including surface of a substrate. Embodiments of method 300 may be performed by any suitable hardware and software, including the hardware and software described herein. It will be appreciated that portions of the processes described in method 300 may be omitted, reordered, and/or supplemented without departing from the scope of the present disclosure.

At 302, method 300 includes supporting a substrate in a reactor. A metal oxide protective layer may be formed on an exposed halogen-sensitive surface of any suitable substrate without departing from the present disclosure. Further, the substrate may have any suitable topography, including planar and non-planar surfaces that are exposed for deposition.

In some embodiments, supporting the substrate in the reactor may include adjusting one or more reactor conditions, such as temperature, pressure, and/or inert gas (e.g., Ar, $N_2$, or He) flow rate, to conditions suitable for film formation prior to processing the substrate. It will be appreciated that such film formation conditions may vary according to film deposition process chemistry, substrate surface termination, and so on.

For example, reactor conditions may be adjusted to facilitate the formation of surface active species from suitable film precursors by activating surface adsorption and decomposition processes. Reactor conditions may also be adjusted to facilitate film formation by activating the reaction of such surface active species with a suitable reactant, whether present in the gas phase or on the surface. In some scenarios, reactor conditions may be adjusted to avoid gas phase decomposition reactions for one or more of precursors and/or reactants, potentially avoiding film contamination from decomposition products and/or poor step coverage resulting from diffusion effects. Further, in some scenarios, reactor conditions may be adjusted to avoid condensation of precursors and/or reactants on various reactor surfaces, potentially avoiding small particle defect generation processes.

Non-limiting reactor pressures for processes used to form a metal oxide protective layer comprising titanium and oxygen include pressures ranging from 0.1 Torr to 10 Torr, within an acceptable tolerance. Non-limiting reactor temperatures for such processes include temperatures ranging from 100° C. to 400° C., within an acceptable tolerance. In some scenarios, processes that form a metal oxide protective layer at a temperature nearer the lower end of the range may provide a faster film formation rate. This may enhance manufacturability of the film and/or reduce an amount of precursor consumed during film formation. In some other scenarios, processes that form a metal oxide protective layer at a temperature nearer the upper end of the range may provide a film with comparatively higher purity. For example, some metal oxide protective layers may be formed from non-halogenated metal oxide precursors including organometallic complexes, as described in more detail below. Using such precursors with comparatively higher processing temperatures may decrease carbon residue in the metal oxide protective layer. In turn, the metal oxide protective layer may be more resistant to some etch processes.

In the example shown in FIG. 3, method 300 enters a film formation cycle after supporting the substrate in the reactor at 302. As used herein, a film formation cycle refers to a film formation event that includes a single exposure of the non-halogenated metal oxide precursor and a single exposure of an oxygen-containing reactant. It will be appreciated that any suitable adjustments to the reactor conditions may be made during the film formation cycle, including adjustments to temperature, pressure, and/or the flow rates of various gases supplied to the reactor during the film formation cycle.

The film formation cycle shown in FIG. 3 includes processes 304 through 310. It will be appreciated that the arrangement and order of processes shown in the film formation cycle depicted in FIG. 3 are provided for illustrative purposes only, and may be varied in any suitable way in some embodiments.

At 304, method 300 includes supplying a non-halogenated metal oxide precursor to the reactor during a precursor supply portion of the film formation cycle. Any suitable non-halogenated metal oxide precursor may be employed without departing from the scope of the present disclosure. Non-limiting examples of non-halogenated metal oxide precursors include transition metal alkoxides (e.g., titanium tetraethoxide ($Ti(OC_2H_5)_4$), titanium tetramethoxide ($Ti(OCH_3)_4$), titanium tetraisopropoxide ($Ti(i-OC_3H_7)_4$, and titanium tetra-n-butoxide ($Ti(n-OC_4H_9)_4$)); transition metal amino complexes (e.g., tetrakis(dimethylamido)titanium ($Ti(N(CH_3)_2)_4$) and tetrakis(diethylamido)titanium (Ti(N(C$_2$H$_5$)$_2$)$_4$)); transition metal silanes (e.g., tetrakis(trimethylsilylmethyl)titanium (Ti((CH$_3$)SiCH$_2$)$_4$)); and transition metal cyclopentadiene complexes (e.g., (η8-cyclooctatetraene)(η5-cyclopentadienyetitanium (C$_{13}$H$_{13}$Ti), di-1,3-cyclopentadien-1-yl[bis(N-methylmethanaminato)]titanium (C$_{14}$H$_{22}$N$_2$Ti), and dicyclopentadienyl titanium diazide (C$_{10}$H$_{10}$N$_6$Ti).

While the example non-halogenated precursors described above relate to transition metals for clarity, it will be appreciated that non-transition metal versions may be employed in some embodiments without departing from the scope of the present disclosure. As non-limiting examples of non-halogenated non-transition metal oxide precursors, aluminum alkyl complexes, aluminum alkoxides, aluminum silanes, aluminum amino complexes, and aluminum cyclopentadiene complexes may be employed in some embodiments. Further, it will be appreciated that, in some embodiments where the halogen-sensitive metal-including layer is sensitive to a particular halogen, the non-halogen metal oxide precursor may exclude that halogen. For example, if the halogen-sensitive metal-including layer is sensitive to chlorine, the non-halogenated metal oxide precursor may be a non-chlorinated metal oxide precursor.

It will be appreciated that the amount of the non-halogenated metal oxide precursor supplied to the reactor during process 304 may vary according to, among other factors, the topography of the exposed surface of the substrate, the film formation conditions present in the reactor, and the adsorption rate and/or the sticking coefficient of the precursor on the surface under those conditions. In one non-limiting process for depositing the metal oxide protective layer comprising titanium and oxygen, titanium tetramethoxide (Ti(OCH$_3$)$_4$) may be supplied to the reactor in a pulse having a duration ranging from 0.5 to 20 seconds, within an acceptable tolerance, for a 300-mm substrate. In a non-limiting process for depositing a metal oxide protective layer comprising aluminum and oxygen, trimethylaluminum (Al$_2$(CH$_3$)$_6$) may be supplied to the reactor in a pulse having a duration ranging from 0.03 to 10 seconds, within an acceptable tolerance, for a 300-mm substrate.

Without wishing to be bound by theory, as the non-halogenated metal oxide precursor is supplied to the reactor, gas phase molecules of the precursor may adsorb on the exposed surface of the substrate. Some of the gas phase molecules may become chemically adsorbed (e.g., chemisorbed) to the surface at sites on the surface that activate such chemisorption reactions. Such chemisorbed species may form surface active species of the non-halogenated metal oxide precursor, e.g., a metal-including active species derived from the non-halogenated metal oxide precursor may be formed on the surface. Because a metal-including active species is bound to at least one surface site until a further reaction occurs, adsorption of the non-halogenated metal oxide precursor may occur in a self-limiting manner. In turn, the film formed during a film formation cycle may be moderated at least in part by the surface reactions of the metal-including active species with a subsequently-supplied reactant, as described in more detail below.

In some embodiments, a full monolayer of metal-including active species may be formed in each film formation cycle. In some other embodiments, less than a full monolayer of metal-including active species may be formed in each deposition cycle. For example, in some embodiments for forming a metal oxide protective layer comprising titanium and oxygen on a halogen-sensitive metal-including layer that includes Sr, each film formation cycle may deposit approximately 0.5 Å of film. In another example where a metal oxide protective layer including aluminum and oxygen is formed, each film formation cycle may deposit approximately 1 Å of film.

It will be appreciated that relative amounts of the non-halogenated metal oxide precursor may be supplied to the reactor according to any suitable technique. Non-limiting examples include controlling mass or volume flows of vapor or liquid precursor sources using suitable valves, flow controllers, pressure controllers, and so on. Other examples include, but are not limited to, controlling precursor supply via a phase change from one state to another, such as by controlling temperatures and/or pressures of liquid or solid precursor sources.

At 306, method 300 includes removing the non-halogenated metal oxide precursor from the reactor. Removing the non-halogenated metal oxide precursor from the reactor includes removing gas phase molecules of the precursor and molecules of the precursor that are condensed on the surface but that are not chemically adsorbed to it. Such physically adsorbed (e.g., physisorbed) molecules may be condensed on the surface in more than one layer or may be distributed in non-uniform ways (such as being condensed within narrow openings formed in the exposed surface). Removing non-chemisorbed precursor molecules may prevent reaction of such molecules with subsequently-introduced oxygen-containing reactant. In turn, it may be possible that non-uniform, non-conformal film formation and/or small particle defect generation that may result from residual, non-chemisorbed molecules of the precursor may be avoided.

It will be appreciated that any suitable approach for removing residual non-halogenated metal oxide precursor from the reactor may be employed without departing from the scope of the present disclosure. For example, in some embodiments, the reactor may be evacuated to a base pressure. Additionally or alternatively, in some embodiments, the reactor may be supplied with a suitable displacement gas, such as Ar, N$_2$, or He. In one non-limiting example of a process used to form a metal oxide protective layer comprising titanium and oxygen, the reactor may be purged or evacuated for at least 0.1 second, within an acceptable tolerance, to remove residual non-halogenated metal oxide precursor from the reactor. Similar purge or evacuation times may be employed when forming a metal oxide protective layer comprising aluminum and oxygen.

At 308, method 300 includes supplying an oxygen-containing reactant to the reactor. Without wishing to be bound by theory, the oxygen-containing reactant may be activated to form gas-phase activated species and/or surface-adsorbed activated species. Such activated species may react with metal-including active species on the exposed surface of the substrate to form the metal oxide protective layer. Because the population of metal-including active species may moderate the film deposition rate somewhat, the reaction between the metal-including active species and the activated species formed from the reactant may be comparatively fast, potentially avoiding thickness non-uniformity that might otherwise result from mass transport effects.

Any suitable oxygen-containing reactant may be employed without departing from the scope of the present disclosure. Non-limiting examples of oxygen-containing reactants that may be used include O$_2$, O$_3$, and H$_2$O. In one non-limiting example of a process used to form a metal oxide protective layer comprising titanium and oxygen, H$_2$O may be supplied in a pulse having a duration ranging from 1 to 20 seconds, within an acceptable tolerance, for a 300-mm substrate. In a non-limiting process used to deposit a metal oxide protective layer comprising aluminum and oxygen, H$_2$O may be supplied in a pulse having a duration ranging from 0.05 to 10 seconds, within an acceptable tolerance, for a 300-mm substrate.

At 310, method 300 includes removing the oxygen-containing reactant from the reactor. Removing the oxygen-containing reactant from the reactor includes removing gas phase molecules and surface-adsorbed oxygen-containing reactant. Removing residual oxygen-containing reactant may prevent unwanted gas phase or surface reactions that may result from introduction of non-halogenated metal oxide precursor during a subsequent layer formation cycle. In turn, non-uniform, non-conformal film formation and/or small particle defect generation resulting from reaction between residual oxygen-containing reactant molecules and the precursors may be avoided.

It will be appreciated that any suitable approach for removing residual oxygen-containing reactant from the reactor may be employed without departing from the scope of the present disclosure. For example, in some embodiments, the reactor may be evacuated to a base pressure. Additionally or alternatively, in some embodiments, the reactor may be supplied with a suitable displacement gas, such as Ar, $N_2$, or He. It will be appreciated that, in some embodiments, processes for removing residual oxygen-containing reactant may vary from processes for removing the precursors. For example, it may take longer to purge the reactant from the reactor due to a comparatively greater sticking coefficient for the reactant relative to the precursors. In one non-limiting example of a process used to form a metal oxide protective layer comprising titanium and oxygen, the reactor may be purged or evacuated for at least 1 second, within an acceptable tolerance, to remove residual oxygen-containing reactant from the reactor. In a non-limiting example of a process used to form a metal oxide protective layer comprising aluminum and oxygen, the reactor may be purged or evacuated for at least 0.1 second, within an acceptable tolerance.

Because the metal oxide protective layer may be formed via a self-limiting adsorption and reaction film formation process, in some embodiments, each film formation cycle may yield a predictable thickness of film, within an acceptable tolerance. Consequently, in some of such embodiments, any suitable thickness of metal oxide protective layer may be formed by repeating the film formation cycle a suitable number of times. Thus, method 300 includes, at 312, determining whether to form another layer of the metal oxide protective layer. If another layer is to be formed, method 300 returns to 304; if not, film formation is completed and the substrate is removed from the reactor at 314.

While method 300 generally describes an atomic layer deposition film formation process, it will be appreciated that any suitable film formation process may be employed to form the metal oxide protective layer without departing from the scope of the present disclosure. In some embodiments, the layer-by-layer film formation process provided by ALD may permit precise, predictable control of the thickness of the metal oxide protective layer. However, in some embodiments, chemical vapor deposition (CVD) may be employed, as CVD techniques typically form films at a relatively faster deposition rate than ALD processes. Further, it will be appreciated that some embodiments of the film formation processes described herein may cause the metal oxide protection layer to relax into or consume portions of an upper layer of the halogen-sensitive metal-including film.

Figure 4:
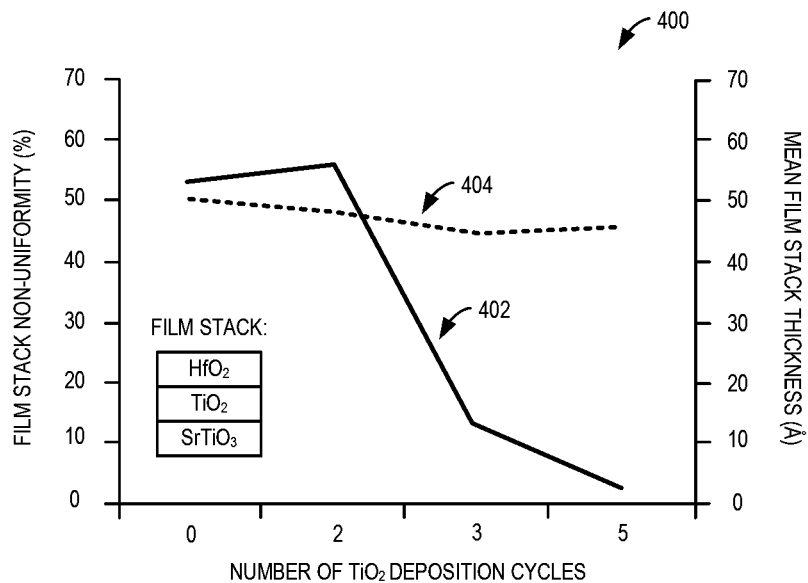
FIG. 4 shows film stack thickness and uniformity data for $HfO_2$ films formed on a metal oxide protective layer having an underlying $SrTiO_3$ film according to an embodiment of the present disclosure.

It will be appreciated that the metal oxide protective layer may be provided in any suitable thickness. FIG. 4 shows ellipsometrically-measured film stack thickness and uniformity data 400 for $HfO_2$ films of a constant thickness formed via an $HfCl_4$ precursor on varying thicknesses of embodiments of a $TiO_2$ metal oxide protective layer. The example $TiO_2$ metal oxide protective layers represented in FIG. 4 were deposited on identical halogen-sensitive $SrTiO_3$ films. Film stack non-uniformity data 402 depicts a relationship between the number of $TiO_2$ film formation cycles, which is proportionate to the thickness of $TiO_2$ film deposited on the surface of the $SrTiO_3$ film, and the non-uniformity of a film stack having an $HfO_2$ film on top.

As shown by film stack non-uniformity data 402, increasing the thickness of the $TiO_2$ film decreases the film stack non-uniformity. For example, film stacks having at least 3 $TiO_2$ film formation cycles (corresponding to approximately 1.5 Å of a $TiO_2$ metal oxide protective layer in this example) exhibit approximately 13% within-substrate non-uniformity on top of the $TiO_2$ layer. Film stacks that include 2.5 Å of a $TiO_2$ metal oxide protective layer formed from 5 film formation cycles exhibit approximately 3% within-substrate non-uniformity on top of the $TiO_2$ layer. A 5 Å layer of a $TiO_2$ metal oxide protective film may exhibit a within-substrate uniformity of approximately 2%, and a 20 Å layer of a $TiO_2$ metal oxide protective film may exhibit a within-substrate uniformity of approximately 1%.

Further, mean film stack thickness data 404 may indicate that dramatic changes in surface non-uniformity may be achieved using metal oxide protective layers that occupy just a fraction of the total film stack. For the example 5-cycle $TiO_2$ metal oxide protective layer shown in FIG. 4, the mean film stack thickness is approximately 46 Å, only 2.5 Å of which is occupied by the $TiO_2$ metal oxide protective layer. Thus, the $TiO_2$ metal oxide protective layer represents 5% or less of the total film stack. Thus, even relatively thin films of metal oxide protective layers may provide a substantial enhancement in the uniformity of film stacks. Moreover, in the example shown in FIG. 4, mean film stack thickness data 404 depicts an approximate 10% decrease in film stack thickness for film stacks that include a 5-cycle $TiO_2$ metal oxide protective layer. This may suggest a decrease in discontinuities (e.g., islands) in the $HfO_2$ film. Consequently, embodiments of metal oxide protective layers may provide an approach to permit halogen-sensitive metal-including layers to be used with halogen-based film formation processes when forming device structures where device performance is strongly dependent on device structure dimensionality (e.g., device structure thickness).

Figure 5:
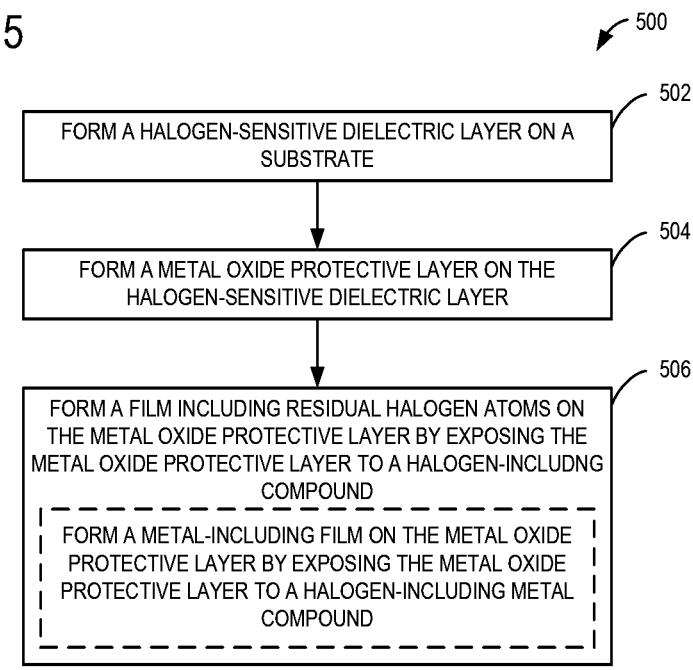
FIG. 5 shows a method of forming a gate assembly for a semiconductor device according to an embodiment of the present disclosure.

For example, FIG. 5 shows an embodiment of a method 500 of forming a gate assembly for semiconductor device, the gate assembly including a metal oxide protective layer. At 502, method 500 comprises forming a halogen-sensitive gate dielectric layer on a substrate. In some embodiments, the halogen-sensitive gate dielectric layer may be formed via a suitable ALD process, though it will be appreciated that any suitable process for forming the gate dielectric layer may be employed without departing from the scope of the present disclosure.

At 504, method 500 comprises forming a metal oxide protective layer on the halogen-sensitive gate dielectric layer. As described in more detail below, any suitable thickness of metal oxide protective layer may be formed according to an embodiment of method 300. In some embodiments, the metal oxide protective layer may be formed in the semiconductor processing tool or reactor used to form the gate dielectric layer. This may prevent exposure of the gate dielectric layer to a vacuum and/or air break that might form an undesirable adlayer on top of the gate dielectric layer, potentially altering one or more electrical characteristics of the device.

At 506, method 500 comprises forming a film comprising residual halogen atoms on the metal oxide protective layer by exposing the metal oxide protective layer to a halogen-including compound. In some embodiments, a metal-including film may be formed on the metal oxide protective layer by exposing the metal oxide protective layer to a halogen-including metal compound. Non-limiting halogen-including metal compounds include $TiCl_4$ and $HfCl_4$. In some embodiments, the film comprising residual halogen atoms may be formed in the semiconductor processing tool or reactor used to form the gate dielectric layer and/or the metal oxide protective layer so that a vacuum and/or air break during film stack formation may be avoided.

Residual halogen atoms included in the film formed on top of the metal oxide protective layer are measurably present in the formed film. For example, in some embodiments, an $HfO_2$ film formed from $HfCl_4$ may have less than 0.5 at % Cl atoms as measured by Rutherford backscattering spectrometry (RBS). The residual halogen atoms may originate from reaction of the halogen-including compound during formation of the film on top of the metal oxide protective layer. For example, halogen ligands included in the halogen-including compound may remain in the film after the film formation process.

Figure 6:
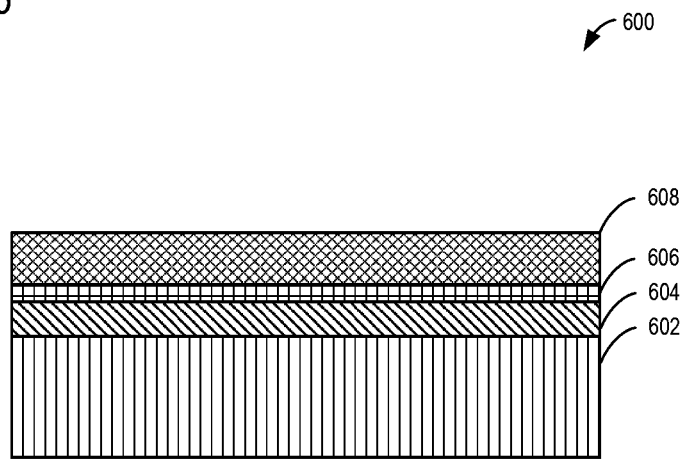
FIG. 6 schematically shows a film stack for a semiconductor device according to an embodiment of the present disclosure.
Figure 7:
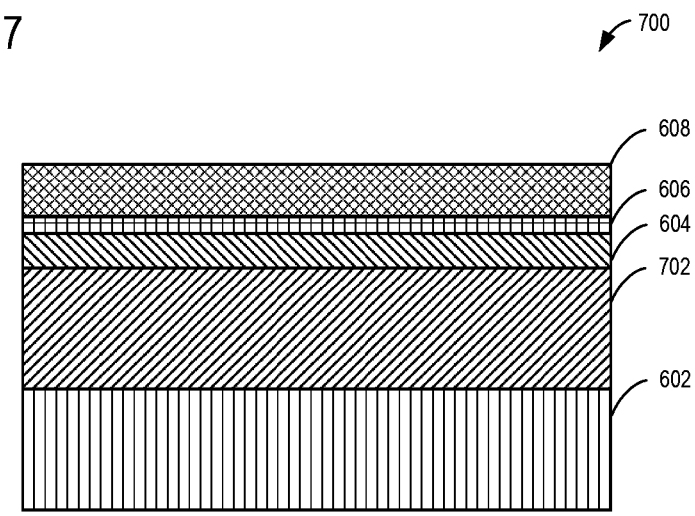
FIG. 7 schematically shows another film stack for a semiconductor device according to an embodiment of the present disclosure.

It will be appreciated that embodiments of method 500 may be used to build film stacks used in any suitable semiconductor device. FIGS. 6-7 schematically depict embodiments of film stacks that may be used in the formation of a gate assembly structure for a semiconductor device.

FIG. 6 schematically shows an embodiment of a film stack 600 that includes a metal oxide protective layer formed according to the present disclosure. As shown in FIG. 6, film stack 600 includes a substrate 602, a halogen-sensitive high-K dielectric layer 604, a metal oxide protective layer 606, and a film 608 formed on top of the metal oxide protective layer. Substrate 602 may include any suitable substrate. One non-limiting example substrate includes a silicon (Si) substrate. Regardless of the type of substrate, it will be appreciated that the substrate may include various films and/or structures resulting from prior processing of the substrate. In some embodiments, substrate 602 may include a native surface layer of a different composition (not shown). For example, a silicon substrate may include a native $SiO_2$ surface layer formed by exposure to ambient air.

In the embodiments shown in FIGS. 6-7, the surface of substrate 602 is planar. However, it will be appreciated that, in some other embodiments, the substrate surface may be non-planar. For example, in some embodiments, the substrate surface may include a non-planar surface topography that may comprise one or more fins, troughs, vias, mesas, or other structures in any suitable density.

Halogen-sensitive high-K dielectric layer 604 is formed on top substrate 602. Any suitable high-K dielectric material may be employed without departing from the scope of the present disclosure. Non-limiting example gate dielectric materials include high-K gate dielectric materials, including transition metal oxides such as $HfO_2$ and alkaline earth metal-including metal oxides such as $SrTi_xO_y$, $BaTi_xO_y$, $SrO$, and $Sr_xBa_{(1-x)}Ti_yO_z$. In some embodiments, a thickness of halogen-sensitive high-K dielectric layer 604 may be included to adjust one or more device parameters such as EOT, drive current, threshold voltage, or device leakage. For example, halogen-sensitive high-K dielectric layer 604 may include a layer of $SrTi_xO_y$ having a thickness ranging from 1 Å to 50 Å, within an acceptable tolerance.

Metal oxide protective layer 606 is formed on a top surface of halogen-sensitive high-K dielectric layer 604 in a suitable thickness to prevent interaction of halogen-sensitive high-K dielectric layer 604 with a halogen-including compound used to form film 608. For example, thickness values may be selected based upon device performance considerations, manufacturing process parameters, and/or device architectural parameters, as described in some non-limiting examples provided below. It will be appreciated that the thickness of metal oxide protective layer 606 may also vary according to the material included in metal oxide protective layer 606.

Film 608 comprises a film including residual halogen atoms formed on metal oxide protective layer 606. In some embodiments, film 608 may comprise a metal-including dielectric material. For example, film 608 may include a high-K dielectric material at a thickness selected to adjust one or more device parameters such as EOT, drive current, threshold voltage, or device leakage. In some embodiments, film 608 may represent a layer of $HfO_2$ having a thickness 5 Å or less, within an acceptable tolerance.

In some of such embodiments, metal oxide protective layer 606 may have a thickness selected based upon physical film characteristics and/or device electrical characteristics as well as surface sensitive considerations. For example, metal oxide protective layer 606 may have a thickness ranging from 1.5 Å to 5 Å, within an acceptable tolerance. Further, depending on the thickness of film selected, the within-substrate non-uniformity of metal oxide protective layer 606 may be less than or equal to 13% (e.g., for a 1.5 Å film), less than or equal to 3% (e.g., for a 2.5 Å film), or less than or equal to 2% (e.g., for a 5 Å film). Providing highly uniform films at a very thin film thickness may provide a suitable base for deposition of film 608 while maintaining film stack thickness within a preselected range. This may be desirable in some embodiments where film stack 600 represents a gate assembly.

In some other embodiments, film 608 may comprise a metal-including barrier material. For example, a metal-including barrier material formed between underlying dielectric materials in the gate assembly and conductive materials formed on top of the barrier material may prevent diffusion of the conductive material into the gate dielectric. Non-limiting examples of metal-including barrier materials include metal nitrides, such as TiN. For example, in some embodiments, film 608 may comprise a layer of TiN having a thickness ranging from 20 Å to 500 Å, within an acceptable tolerance.

In some of such embodiments, metal oxide protective layer 606 may have a thickness selected based upon surface sensitivity considerations as well as device performance characteristics. For example, metal oxide protective layer 606 may be selected and/or adjusted to alter or select various device characteristics. In some of such embodiments, the thickness of metal oxide protective layer 606 may be selected in view of threshold voltage and/or EOT considerations. In such embodiments, metal oxide protective layer 606 may have a thickness ranging from 0.5 Å to 20 Å, within an acceptable tolerance. It will be appreciated that such films may exhibit within-substrate non-uniformity consistent with the example metal oxide protective layers described herein.

It will be appreciated that other gate assemblies may be formed according to embodiments of the methods described herein. For example, FIG. 7 schematically shows an embodiment of a film stack 700 that includes another high-K dielectric layer 702 formed between substrate 602 and halogen-sensitive high-K dielectric layer 604. In some embodiments, high-K dielectric layer 702 may be included in the gate assembly to adjust one or more device parameters such as EOT, drive current, threshold voltage, or device leakage, alone or in concert with halogen-sensitive high-K dielectric layer 604. In some embodiments, high-K gate dielectric layer

702 may include a layer of HfO$_2$ having a thickness ranging from 10 Å to 30 Å, within an acceptable tolerance.

Figure 8:
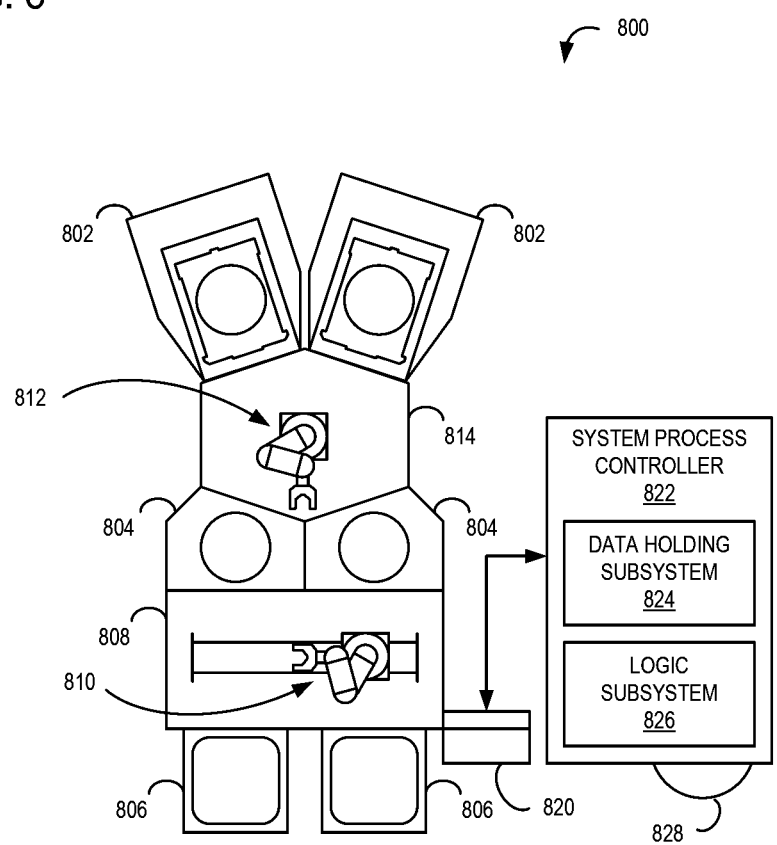
FIG. 8 shows a semiconductor process tool according to an embodiment of the present disclosure.

In some embodiments, the metal oxide protective layers and other films included in the film stacks and structures described herein may be formed using a suitable semiconductor processing tool. FIG. 8 schematically shows a top view of an embodiment of a semiconductor processing tool 800 including a plurality of semiconductor processing modules 802. While the depicted embodiment includes two modules, it will be appreciated that any suitable number of semiconductor processing modules may be provided. For example, some processing tools may include just one module while other processing tools may include more than two modules.

FIG. 8 also shows load locks 804 for moving substrates between portions of semiconductor processing tool 800 that exhibit ambient atmospheric pressure conditions and portions of the tool that are at pressures lower than atmospheric conditions. An atmospheric transfer module 808, including an atmospheric substrate handling robot 810, moves substrates between load ports 806 and load locks 804, where a portion of the ambient pressure is removed by a vacuum source (not shown) or is restored by backfilling with a suitable gas, depending on whether substrates are being transferred into or out of the tool. Low-pressure substrate handling robot 812 moves substrates between load locks 804 and semiconductor processing modules 802 within low-pressure transfer module 814. Substrates may also be moved among the semiconductor processing modules 802 within low-pressure transfer module 814 using low-pressure substrate handling robot 812, so that sequential and/or parallel processing of substrates may be performed without exposure to air and/or without a vacuum break.

FIG. 8 also shows a user interface 820 connected to a system process controller 822. User interface 820 is adapted to receive user input to system process controller 822. User interface 820 may optionally include a display subsystem, and suitable user input devices such as keyboards, mice, control pads, and/or touch screens, for example, that are not shown in FIG. 8.

FIG. 8 shows an embodiment of a system process controller 822 provided for controlling semiconductor processing tool 800. System process controller 822 may operate process module control subsystems, such as gas control subsystems, pressure control subsystems, temperature control subsystems, electrical control subsystems, and mechanical control subsystems. Such control subsystems may receive various signals provided by sensors, relays, and controllers and make suitable adjustments in response.

System process controller 822 comprises a computing system that includes a data-holding subsystem 824 and a logic subsystem 826. Data-holding subsystem 824 may include one or more physical, non-transitory devices configured to hold data and/or instructions executable by logic subsystem 826 to implement the methods and processes described herein. Logic subsystem 826 may include one or more physical devices configured to execute one or more instructions stored in data-holding subsystem 824. Logic subsystem 826 may include one or more processors that are configured to execute software instructions.

In some embodiments, such instructions may control the execution of process recipes. Generally, a process recipe includes a sequential description of process parameters used to process a substrate, such parameters including, but not limited to, time, temperature, pressure, and concentration, as well as various parameters describing electrical, mechanical, and environmental aspects of the tool during substrate processing. The instructions may also control the execution of various maintenance recipes used during maintenance procedures.

In some embodiments, such instructions may be stored on removable computer-readable storage media 828, which may be used to store and/or transfer data and/or instructions executable to implement the methods and processes described herein, excluding a signal per se. It will be appreciated that any suitable removable computer-readable storage media 828 may be employed without departing from the scope of the present disclosure. Non-limiting examples include DVDs, CD-ROMs, floppy discs, and flash drives.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A method of forming a metal oxide protective layer on a surface of a halogen-sensitive metal-including layer present on a substrate processed in a semiconductor processing reactor, the method comprising:
    forming a metal-including active species on the halogen-sensitive metal-including layer, the metal-including active species being derived from a non-halogenated metal oxide precursor,
    reacting an oxygen-containing reactant with the metal-including active species to form the metal oxide protective layer; and
    forming a metal-including film comprising material selected from the group consisting of a metal-including dielectric material and a metal-including barrier material and comprising residual halogen atoms on top of the metal oxide protective layer by exposing the metal oxide protective layer to a halogen-including metal compound.

2. The method of claim 1, where the halogen-sensitive metal-including layer comprises an alkaline earth metal-including metal oxide.

3. The method of claim 1, wherein the metal oxide protecting layer comprises TiO$_2$.

4. The method of claim 1, where the metal-including film includes oxygen or nitrogen.

5. The method of claim 1, where the halogen-including metal compound includes a transition metal.

6. The method of claim 1, where the oxygen-containing reactant is selected from the group consisting of O$_2$, O$_3$, and H$_2$O, and where the non-halogenated metal oxide precursor is selected from the group consisting of metal alkoxides, metal amino complexes, metal silanes, and metal cyclopentadiene complexes.

7. The method of claim 1, further comprising depositing the metal oxide protective layer as a film having a thickness of 20 Å or less.

8. The method of claim 1, further comprising:
after forming the metal-including active species on the halogen-sensitive metal-including layer, removing the non-halogenated metal oxide precursor from the reactor; and
after removing the non-halogenated metal oxide precursor from the reactor, supplying the oxygen-containing reactant to the halogen-sensitive metal-including layer so that the metal-including active species reacts with the oxygen-containing reactant.

9. The method of claim 1, where the halogen-sensitive metal-including layer is sensitive to chlorine and where the non-halogenated metal oxide precursor comprises a non-chlorinated metal oxide precursor.

10. A method of fabricating a semiconductor device, comprising:
forming a halogen-sensitive high-K dielectric material on a substrate;
forming a metal oxide protective layer on the halogen-sensitive high-K dielectric material by reacting a metal-including active species derived from a non-halogenated metal oxide precursor with an oxygen-containing reactant; and
forming a metal-including film comprising material selected from the group consisting of a metal-including dielectric material and a metal-including barrier material and comprising residual halogen atoms on the metal oxide protective layer by exposing the metal oxide protective layer to a halogen-including metal compound.

11. The method of claim 10, where forming the metal oxide protective layer comprises, in a reactor for processing a substrate:
forming the metal-including active species from a non-halogenated metal oxide precursor on the halogen-sensitive high-K dielectric material;
after forming the metal-including active species on the halogen-sensitive high-K dielectric material, removing the non-halogenated metal oxide precursor from the reactor;
after removing the non-halogenated metal oxide precursor from the reactor, supplying the oxygen-containing reactant to the exposed surface; and
reacting the oxygen-containing reactant with the metal-including active species to form the metal oxide protective layer.

12. The method of claim 10, where the halogen-sensitive high-K dielectric material comprises an alkaline earth metal-including metal oxide and where the metal-including film includes oxygen or nitrogen.

13. The method of claim 10, where the halogen-including metal compound includes a transition metal.

14. The method of claim 10, where the oxygen-containing reactant is selected from the group consisting of $O_2$, $O_3$, and $H_2O$, and where the non-halogenated metal oxide precursor is a non-chlorinated metal oxide precursor selected from the group consisting of metal alkoxides, metal amino complexes, metal silanes, and metal cyclopentadiene complexes.

15. The method of claim 10, where forming the metal oxide protective layer on the halogen-sensitive high-K dielectric material comprises forming the metal oxide comprising $TiO_2$.

16. A gate assembly for a semiconductor device, comprising:
a first dielectric layer comprising a halogen-sensitive high-K dielectric material;
a metal oxide protective layer formed on top of the halogen-sensitive high-K dielectric material; and
a film comprising material selected from the group consisting of a metal-including dielectric material and a metal-including barrier material and comprising residual halogen atoms formed on top of the metal oxide protective layer.

17. The device of claim 16, where the film comprising residual halogen atoms comprises a metal-including film formed on top of the metal oxide protective layer via reaction of a halogen-including metal compound.

18. The device of claim 17, where the film comprising residual halogen atoms comprises a transition metal compound.

19. The device of claim 16, where the halogen-sensitive high-K dielectric material comprises an alkaline earth metal-including metal oxide.

20. The device of claim 16, where the metal oxide protective layer comprising $TiO_2$.

* * * * *